United States Patent
Suzuki et al.

(10) Patent No.: US 7,732,821 B2
(45) Date of Patent: Jun. 8, 2010

(54) SILICON CARBIDE SEMICONDUCTOR DEVICE

(75) Inventors: Naohiro Suzuki, Anjo (JP); Tsuyoshi Yamamoto, Kariya (JP); Toshiyuki Morishita, Nagoya (JP)

(73) Assignee: DENSO CORPORATION, Kariya (JP)

( * ) Notice: Subject to any disclaimer, the term of this patent is extended or adjusted under 35 U.S.C. 154(b) by 142 days.

(21) Appl. No.: 12/073,837

(22) Filed: Mar. 11, 2008

(65) Prior Publication Data

US 2008/0224150 A1 Sep. 18, 2008

(30) Foreign Application Priority Data

Mar. 13, 2007 (JP) .............................. 2007-063371

(51) Int. Cl.
H01L 29/72 (2006.01)
(52) U.S. Cl. .................. 257/77; 257/335; 257/409; 257/492; 257/493
(58) Field of Classification Search .................. 257/77, 257/335, 409, 492, 493
See application file for complete search history.

(56) References Cited

U.S. PATENT DOCUMENTS

| 5,712,502 | A | 1/1998 | Mitlehner et al. |
| 6,831,345 | B2 | 12/2004 | Kinoshita et al. |
| 7,049,675 | B2 | 5/2006 | Kinoshita et al. |
| 2007/0045631 | A1 | 3/2007 | Endo et al. |
| 2007/0170436 | A1* | 7/2007 | Sugawara .................. 257/77 |

FOREIGN PATENT DOCUMENTS

| JP | A-H10-503056 | 3/1998 |
| JP | 2003-101039 | 4/2003 |
| WO | WO 96/03774 A1 | 2/1996 |

OTHER PUBLICATIONS

Office Action dated Feb. 24, 2009 in corresponding Japanese patent application No. 2007-063371 (and English translation).
Office Action dated Sep. 25, 2009 in corresponding German patent application No. 10 2008 014 071.6-33 (and English translation).

* cited by examiner

Primary Examiner—Edward Wojciechowicz
(74) Attorney, Agent, or Firm—Posz Law Group, PLC

(57) ABSTRACT

The SiC semiconductor device includes a substrate of a first conduction type made of silicon carbide, a drift layer of the first conduction type made of silicon carbide, the drift layer being less doped than the substrate, a cell portion constituted by a part of the substrate and a part of the drift layer, a circumferential portion constituted by another part of the substrate and another part of the drift layer, the circumferential portion being formed so as to surround the cell portion, and a RESURF layer of a second conduction type formed in a surface portion of the drift layer so as to be located in the circumferential portion. The RESURF layer is constituted by first and second RESURF layers having different impurity concentrations, the second RESURF layer being in contact with an outer circumference of the first RESURF layer and extending to a circumference of the cell portion.

20 Claims, 11 Drawing Sheets

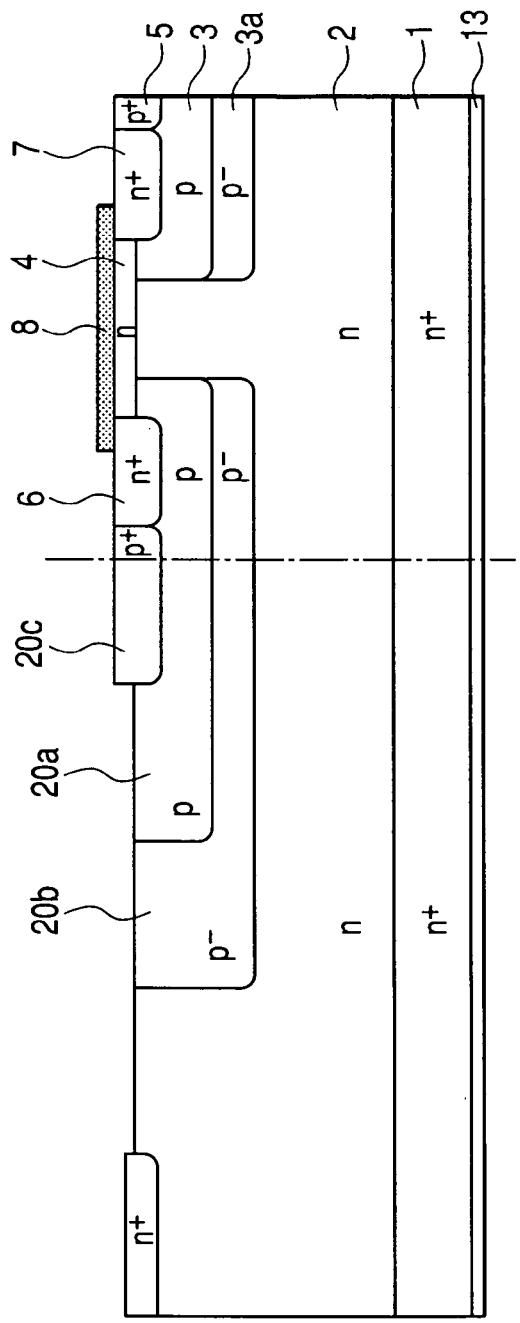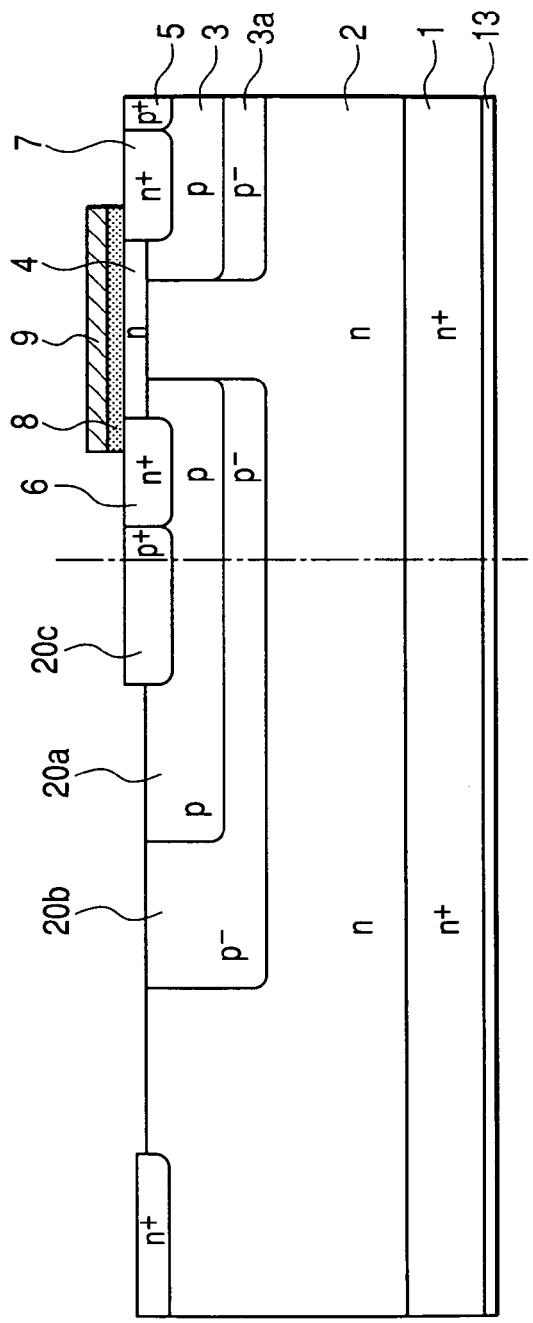
FIG. 4A
FIG. 4B

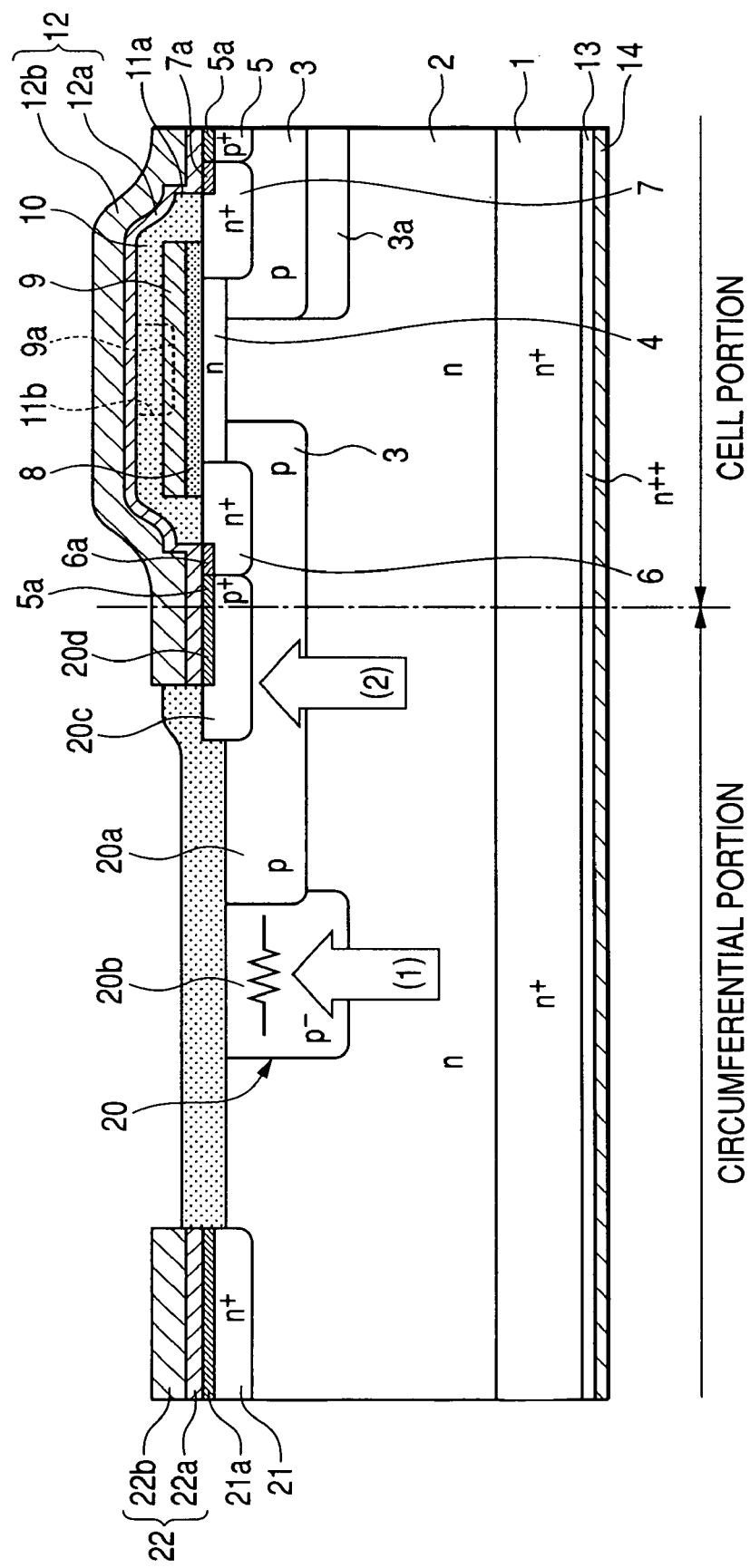

SILICON CARBIDE SEMICONDUCTOR DEVICE

CROSS-REFERENCE TO RELATED APPLICATION

This application is related to Japanese Patent Application No. 2007-63371 filed on Mar. 13, 2007, the contents of which are hereby incorporated by reference.

BACKGROUND OF THE INVENTION

1. Field of the Invention

The present invention relates to a SiC (Silicon Carbide) semiconductor device having a RESURF (Reduced Surface Field) structure at its circumferential portion.

2. Description of Related Art

It is known to provide a silicon power device having a withstand voltage of about 1000 V with a RESURF structure in order to maintain voltage resistance of its circumferential portion. Such a RESURF structure has a cross-section as shown in FIG. 11A. This RESURF structure is made by extending, from a cell portion, a P layer (RESURF layer) J3 doped to $1 \times 10^{17}/cm^3$ over the surface of an N$^-$ drift layer J2 doped to $1 \times 10^{15}/cm^3$ and formed on an n$^+$-type substrate J1. In the power device provided with the RESURF structure, as shown in FIG. 11B, when a voltage is applied between its circumferential side and the back surface of the substrate, a depletion layer largely extends from the RESURF layer J3 located on the surface of the N$^-$ drift layer J2 formed on the substrate J1. This acts to lessen the electric field to maintain voltage resistance of the circumferential portion.

In recent years, SiC is gathering attention as material of power devices due to its high electric field breakdown strength. SiC that has a higher electric field breakdown strength than silicon makes it possible to control a large current. For example, SiC semiconductor devices are expected to be used in motor control for a hybrid vehicle. Devices provided in a hybrid vehicle are required to operate normally in a temperature range from −50 degrees C. to 200 degrees C., assuming that the hybrid vehicle is used under atmospheric temperature of −50 degrees C. to 50 degrees C.

Since SiC is a semiconductor as well as silicon, it is possible to form a RESURF structure of SiC. However, forming a RESURF structure by SiC involves the following problems.

The activation ratio of p-type impurities (the ratio indicating what percentage of doped p-type impurities actually behaves as p-type impurities) has a high temperature-dependence. More specifically, although the activation ratio is almost 100 percent at a temperature of 200 degrees C., it becomes about 1 percent at a temperature of −50 degrees C. Accordingly, if a SiC semiconductor device is designed to have a p-type impurity concentration of $1 \times 10^{17}/cm^3$, although it performs normally at a temperature of 200 degrees C., punch-through phenomenon may be caused at a temperature of −50 degrees C. when the p-type impurity concentration becomes substantially $1 \times 10^{15}/cm^3$. On the other hand, if the SiC semiconductor device is designed to have a p-type impurity concentration of $1 \times 10^{19}/cm^3$ so that it performs normally at a temperature of −50 degrees C., the depletion layer does not extend sufficiently at a temperature of 200 degrees C., causing the voltage resistance to be lowered, because the p-type impurity concentration becomes too high.

Incidentally, Japanese Patent Application Laid-open No. 2003-101039 discloses a structure for preventing lowering of the voltage resistance of a power device. In this structure, a highly doped guard ring layer is formed inside a RESURF layer, and another guard ring layer having about the same impurity concentration as the RESURF layer is formed outside the RESURF layer, so that the voltage resistance of a circumferential RESURF portion is stabilized.

However, although the structure disclosed in this patent document provides the effect of stabilizing the voltage resistance against mask deviation and ion injection variation, it cannot stabilize the voltage resistance against a temperature change in the range between −50 degrees C. and 200 degrees C.

SUMMARY OF THE INVENTION

The present invention provides a silicon carbide semiconductor device comprising:

a substrate of a first conduction type made of silicon carbide;

a drift layer of the first conduction type made of silicon carbide, the drift layer being less doped than the substrate;

a cell portion constituted by a part of the substrate and a part of the drift layer, the cell portion including semiconductor elements;

a circumferential portion constituted by another part of the substrate and another part of the drift layer, the circumferential portion being formed so as to surround the cell portion; and a RESURF layer of a second conduction type formed in a surface portion of the drift layer so as to be located in the circumferential portion;

wherein the RESURF layer is constituted by a first RESURF layer having a first impurity concentration, and a second RESURF layer having a second impurity concentration lower than the first impurity concentration, the second RESURF layer being in contact with an outer circumference of the first RESURF layer and extending to a circumference of the cell portion.

According to the present invention, a SiC semiconductor device having voltage resistance stable over a wide temperature range can be provided.

Other advantages and features of the invention will become apparent from the following description including the drawings and claims.

BRIEF DESCRIPTION OF THE DRAWINGS

In the accompanying drawings:

FIGS. 4A and 4B are diagrams for explaining the method of manufacturing the SiC semiconductor device;

FIG. 10 is a diagram for explaining the actions of the SiC semiconductor device of the third embodiment when a surge intrudes therein;

PREFERRED EMBODIMENTS OF THE INVENTION

Figure 1:
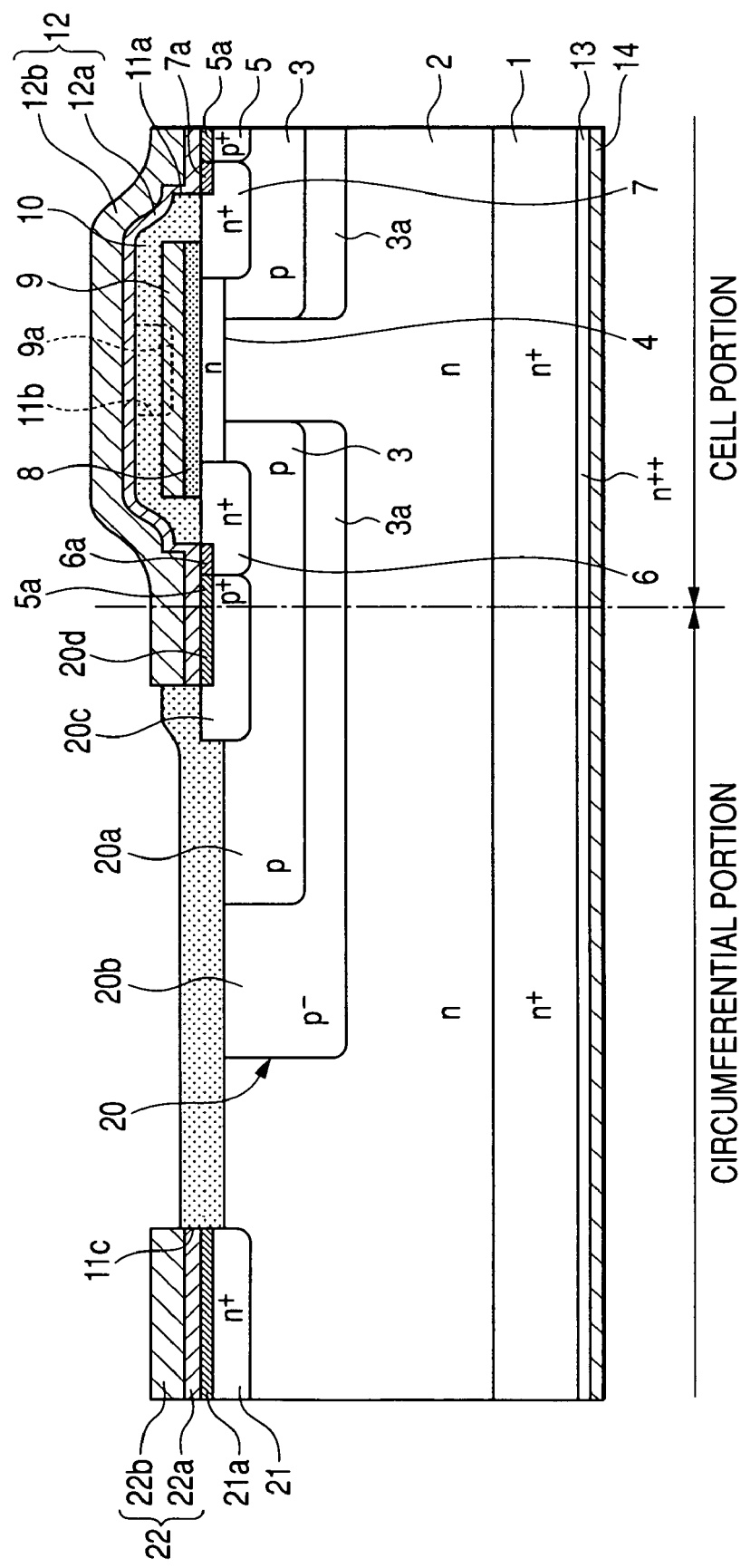
FIG. 1 is a diagram showing a cross-section of a SiC semiconductor device according to a first embodiment of the invention, which is constituted by a planar type MOSFET and a circumferential portion.

Preferred embodiments of the present invention are described below with reference to the drawings. In the below-described embodiments, the same or corresponding components are represented by the same reference numerals or characters.

First Embodiment

FIG. 1 shows a cross-section of a SiC semiconductor device according to a first embodiment of the invention, which includes a planar type MOSFET and a circumferential portion.

As shown in FIG. 1, the planar type MOSFET and the circumferential portion are formed on one surface as a major surface of an $n^+$-type substrate 1 having a thickness of about 300 μm. The $n^+$-type substrate 1 may be made of 4H—SiC whose major surface is a (11-20) surface, and whose n-type impurity concentration is about $1 \times 10^{19}$ cm$^{-3}$ As the n-type impurities of the substrate 1, phosphorus may be used.

On the major surface of the substrate 1, there is formed an n-type drift layer 2 by epitaxial growth. The n-type drift layer 2 is formed to have an impurity concentration of about $5 \times 10^{15}$ cm$^{-3}$, and a thickness of about 10 μm. As the n-type impurities of the n-type drift layer 2, phosphorus may be used.

In a cell portion where the planar type MOSFET is formed, a plurality of p-type base regions are formed at predetermined spacing distances on the surface portion of the n-type drift layer 2. The p-type base regions 3 are formed by ion injection so as to have an impurity concentration of from $1 \times 10^{18}$ to $2 \times 10^{19}$ cm$^{-3}$, and a thickness (depth) of from 0.4 to 1.0 μm. Beneath the p-type base regions 3, there is formed a less-doped p-type layer 3a having an impurity concentration lower than that of the p-type base regions 3 by an order or two of magnitude. The less-doped p-type layer 3a has an impurity concentration of from $5 \times 10^{16}$ to $2 \times 10^{18}$ cm$^{-3}$, and a thickness (depth) of from 0.4 to 1.4 μm. By locating the less-doped p-type layer 3a beneath the p-type base regions 3, there can be obtained a p-type semiconductor region having a structure in which an impurity concentration thereof decreases stepwise with the increase of depth. This makes it possible to improve the voltage resistance, because this structure allows a depletion layer to easily extend therebeneath.

Over the p-type base regions 3, there is formed an n-type channel layer (referred to as "channel epi-layer" hereinafter) 4 for constituting an epitaxially grown channel region such that it connects between the n-type drift layer 2 and a later described $n^+$-type source regions 6, 7. The channel epi-layer 4 has an impurity concentration of about $1 \times 10^{16}$ cm$^{-3}$, and a thickness (depth) of about 0.3 μm.

A $p^+$-type body layer 5 is formed so as to penetrate through the channel epi-layer 4 and reach the p-type base region 3. The $p^+$-type body layer 5 is highly doped to a concentration of about $1 \times 10^{21}$ cm$^{-3}$, and has a thickness of about 0.3 μm.

Inwardly of the $p^+$-type body layer 5, there are formed the $n^+$-type source regions 6, 7 across from the channel epi-layer 4. The $n^+$-type source regions 6, 7 have a high impurity concentration of over $3 \times 10^{20}$ cm$^{-3}$, and a depth of from 0.3 to 0.4 μm.

A gate oxidation film 8 having a thickness of 52 nm, for example, is formed so as to cover at least a surface of the channel region constituted by parts of the surface portion of the channel epi-layer 4, the parts being located on the p-type base regions 3.

On the surface of the gate oxidation film 8, there is patterned a gate electrode 9 made of polysilicon doped with n-type impurities (phosphorus, for example).

An inter-layer insulation film 10 made of BPSG, for example, is formed so as to cover the gate electrode 9 and a remaining part of the gate oxidation film 8. On the inter-layer insulation film 10 and the gate oxidation film 8, there are formed a contact hole 11a leading to the $p^+$-type body layer 5 and $n^+$-type source regions 6, 7, and a contact hole 11b leading to the gate electrode 9. Inside the contact holes 11, 11b, there are provided contact portions 5a, 6a, 7a, 9a made of Ni, or Ti/Ni electrically connected to the $p^+$-type body layer 5 or $n^+$-type source regions 6, 7, and the gate electrode 9. In addition, inside these holes, there are provided a source electrode 12 constituted by an underlayer wire electrode 12a made of Ti and a wire electrode 12b made of Al, and a gate wire.

On the back surface of the substrate 1, there is formed an $n^+$-type drain contact region 13 more highly doped than the substrate 1. This drain contact region 13 is formed with a drain electrode 14 made of Ni, for example, serving as a back surface electrode 14. The planar type MOSFET has a structure described above.

On the other hand, a RESURF layer 20 having a ring like structure is formed on the surface portion of the n-type drift layer 2 so as to surround the cell portion.

The RESURF layer 20, which is a p-type layer, is constituted by a first RESURF layer 20a, and a second RESURF layer 20b less doped than the first RESURF layer 20a.

The first RESURF layer 20a is formed by extending the p-type base region 3 toward the circumference of the cell portion by about 25 μm. This first RESURF layer 20a is ion-injected to have an impurity concentration of from $1 \times 10^{18}$ to $2 \times 10^{19}$ cm$^{-3}$, and it has a thickness of from 0.4 to 1.0 μm.

The second RESURF layer 20b is less doped than the first RESURF layer 20a so as to have an impurity concentration of $5 \times 10^{16}$-$2 \times 10^{18}$ cm$^{-3}$, and has a thickness of from 0.4 to 1.4 μm. In this embodiment, the second RESURF layer 20b has such a structure that it is in contact with the outer circumference of the first RESURF layer 20a and extends toward the circumference of the cell portion farther than the first RESURF layer 20a, and extends deeper than the first RESURF layer 20a. An extrusion depth of the first RESURF layer 20a into the cell portion may be about 25 μm.

On the surface portion of the first RESURF layer 20a, there is provided a $p^+$-type contact region 20c extending from the $p^+$-type body layer 5 of the planar type MOSFET. On the surface of the contact region 20c, there is provided a contact portion 20d made of Ni or Ti/Ni and electrically connected to the surface of the contact region 20c. The RESURF layer 20 is electrically connected to the source electrode 12 through the contact portion 20d.

At a circumferential side of the cell portion further outer than the RESURF layer 20, there is formed an equipotential ring 21 constituted by an n+-type layer. The equipotential ring 21 has an impurity concentration of over $3 \times 10^{20}$ cm$^{-3}$, and has a depth of from 0.3 to 0.4 μm. The equipotential ring 21 is electrically connected to an electrode 22 constituted by an underlayer wire electrode 22a and a wire electrode 22b made of Al through the contact region 21a. The equipotential ring 21 is set in the potential as the drain electrode 14.

The planar type MOSFET of the SiC semiconductor device having the above described structure operates to pass a current between the n+-type source regions 6, 7 and the drain contact region 13 through the channel epi-layer 4 serving as a channel region. By controlling a voltage applied to the gate electrode 9 to thereby control the width of the depletion layer formed in the channel region, the current flowing between the n+-type source regions 6, 7 and the drain contact region 13 can be controlled.

On the other hand, in the circumferential portion, the RESURF layer 20 is constituted by the first RESURF layer 20a, and the second RESURF layer 20b. Since the depletion layer expands into the less doped second RESURF layer 20b at a high temperature, and further expands into the highly doped first RESURF layer 20a at a low temperature, it becomes possible to maintain the high voltage resistance of about 1000 V in a temperature range from −50 degrees C. to 200 degrees C. Next, the action of the RESURF layer 20 is explained for a case when the temperature of the SiC semiconductor device is 200 degrees C., and for a case when it is −50 degrees C.

Case 1: When the Temperature is 200 Degrees C.

In this case, since the activation ratio of p-type impurities is nearly 100%, the p-type base region 3 and the first RESURF layer 20a can be assumed to have an activated impurity concentration of from $1 \times 10^{18}$ to $2 \times 10^{19}$ cm$^{-3}$, and the less-doped p-type layer 3a and the second RESURF layer 20b can be assumed to have an activated impurity concentration of from $5 \times 10^{16}$ to $2 \times 10^{18}$ cm$^{-3}$.

In the cell portion, a depletion layer expands from a boundary between the p-type base region 3 and the n-type drift layer 2. At this time, virtually, it expands only toward the side of the n-type drift layer 2, because the activated impurity concentration in the p-type base region 3 is much higher than that in the n-type drift layer 2. The depletion layer extends to a JFET region between the n-type drift layer 2 and the p-type base region 3, and further extends to the substrate 1 that constitutes a drain region. At this time, the voltage resistance of the planar-type MOSFET is over 1000 V.

On the other hand, in the circumferential portion, a depletion layer expands from a boundary between the second RESURF layer 20b and the n-type drift layer 2. The impurity concentration of the n-type drift layer 2 is about one tenth that of the second RESURF layer 20b, and the thickness of the n-type drift layer 2 is about ten times that of the second RESURF layer 20b. Accordingly, since the acceptors of the second RESURF layer 20b and the donors of the n-type drift layer 2 cancel out each other when the depletion layer expands, the second RESURF layer 20b and the n-type drift layer 2 behave as if their impurity concentration are lowered. Therefore, the depletion layer expands significantly, as a consequence of which the voltage resistance becomes over 1000 V.

As explained above, the SiC semiconductor device has voltage resistance over 1000 V at a temperature of 200 degrees C.

Case 2: when the Temperature is −50 Degrees C.

In this case, since the activation ratio of p-type impurities is about 1%, the p-type base region 3 and the first RESURF layer 20a can be assumed to have an activated impurity concentration of from $1 \times 10^{16}$ to $2 \times 10^{17}$ cm$^{-3}$, and the less-doped p-type layer 3a and the second RESURF layer 20b can be assumed to have an activated impurity concentration of from $5 \times 10^{14}$ to $2 \times 10^{16}$ cm$^{-3}$.

In the cell portion, a depletion layer expands from a boundary between the p-type base region 3 and the n-type drift layer 2. At this time, since the activated impurity concentration of the p-type base region 3 is about 10% of that of the n-type drift layer 2, the depletion layer expands not only into the n-type drift layer 2, but also into the p-type base region 3. However, it does not punch through the p-type base region 3. The depletion layer extends to a JFET region between the n-type drift layer 2 and the p-type base region 3, and further extends to the substrate 1 constituting the drain region. At this time, the voltage resistance of the planar-type MOSFET is over 1000 V.

On the other hand, in the circumference portion, a depletion layer expands from a boundary between the second RESURF layer 20b and the n-type drift layer 2. At this time, since the activated impurity concentration of the second RESURF layer 20b is about one tenth that of the n-type drift layer 2, this depletion layer easily punches through, and reaches the first RESURF layer 20a. Although the activated impurity concentration of the n-type drift layer 2 is about one tenth that of the first RESURF layer 20a at this time, the thickness of the n-type drift layer 2 is about ten times that of the first RESURF layer 20a. Accordingly, since the acceptors of the first RESURF layer 20a and the donors of the n-type drift layer 2 cancel out each other when the depletion layer expands, the first RESURF layer 20a and the n-type drift layer 2 behave as if their impurity concentration are lowered. Therefore, the depletion layer expands greatly, as a consequence of which the voltage resistance becomes over 1000 V.

As explained above, the SiC semiconductor device has voltage resistance over 1000 V also at a temperature of −50 degrees C.

Next, a method of manufacturing the SiC semiconductor device according to the first embodiment of the invention will be explained with reference to the drawings showing manufacturing processes.

Figure 2A:
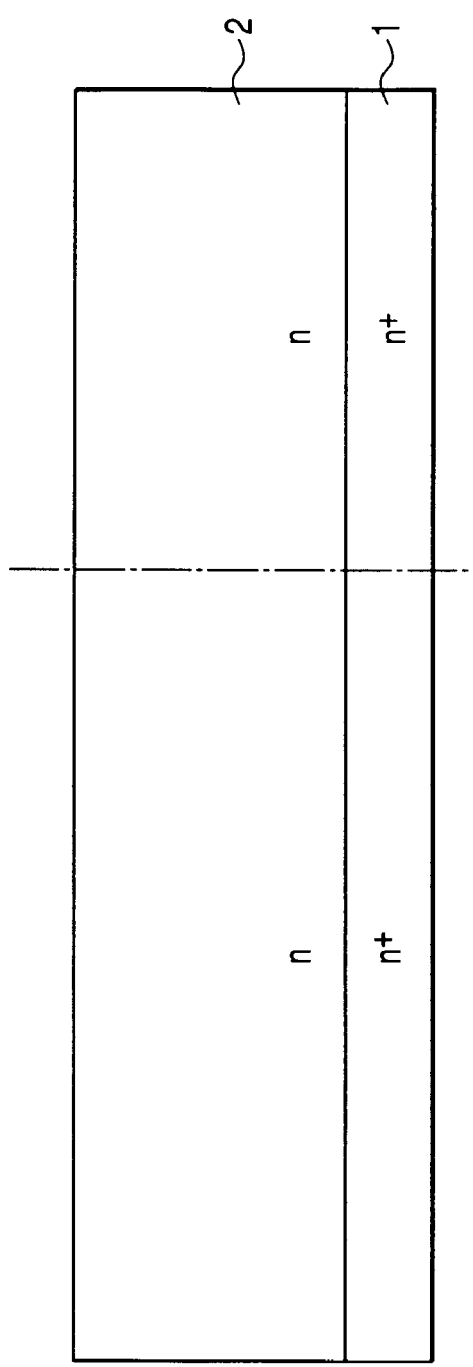
FIGS. 2A and 2B are diagrams for explaining a method of manufacturing the SiC semiconductor device.

Manufacturing Process Shown in FIG. 2A

After the n+-type substrate 1 is prepared, the n-type drift layer 2 is epitaxially grown on the major surface of the substrate 1 so as to have an impurity concentration of about $1 \times 10^{16}$ cm$^{-3}$, and a thickness of 10 μm.

Figure 2B:
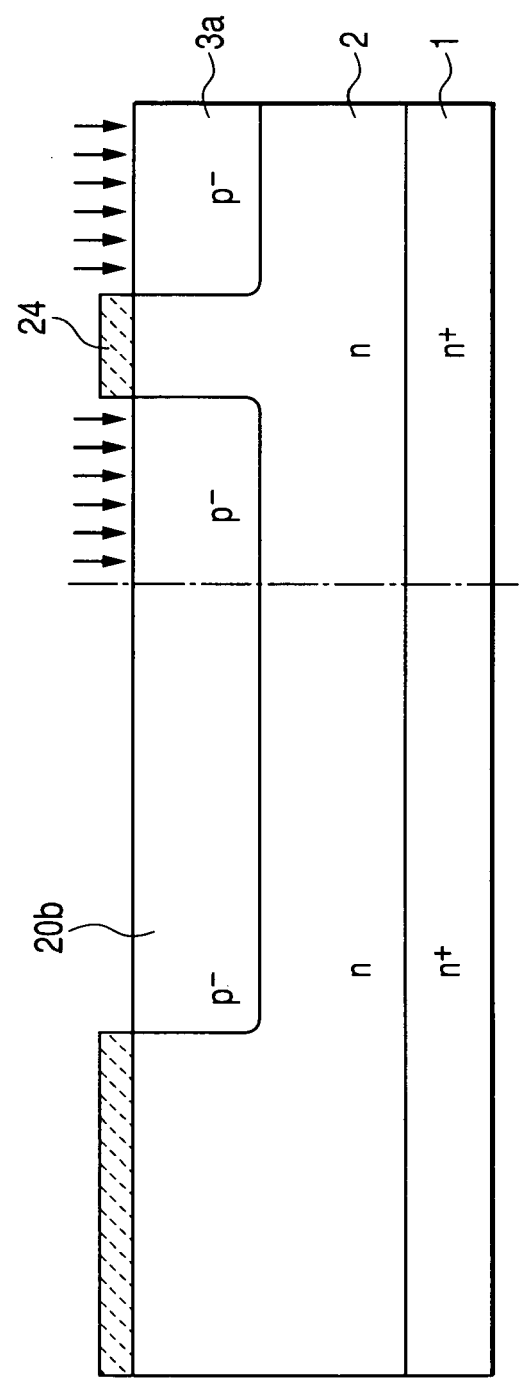

Manufacturing Process Shown in FIG. 2B

On the surface of the n-type drift layer 2, there is put a mask 24 to which a prospective region for forming the less-doped p-type layer 3a and the second RESURF layer 20b is opened. Thereafter, by performing ion injection of p-type impurities (aluminum, for example), and activation, the less-doped p-type layer 3a and the second RESURF layer 20b are formed at the same time.

Figure 3A:
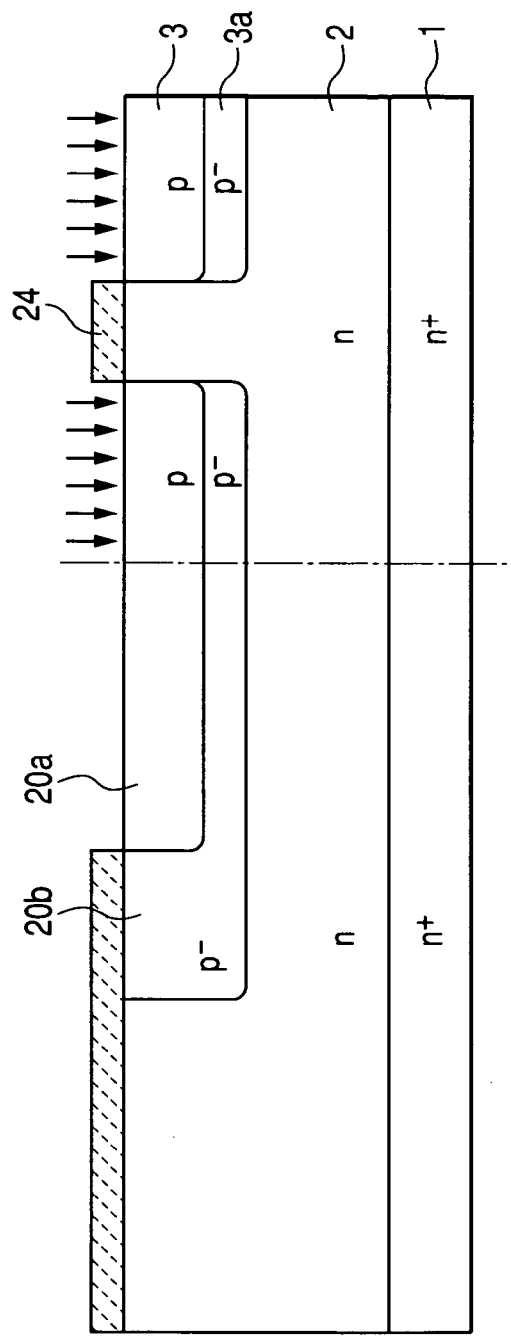
FIGS. 3A and 3B are diagrams for explaining the method of manufacturing the SiC semiconductor device.

Manufacturing Process Shown in FIG. 3A

After removing the mask 24, there is put, on the surface of the n-type drift layer 2, a mask 25 to which a prospective region for forming the p-type base regions 3 and the first RESURF layer 20a is opened. Thereafter, by performing ion injection of p-type impurities (aluminum, for example) and activation, the p-type base regions 3 and the first RESURF layer 20a are formed at the same time.

Figure 3B:
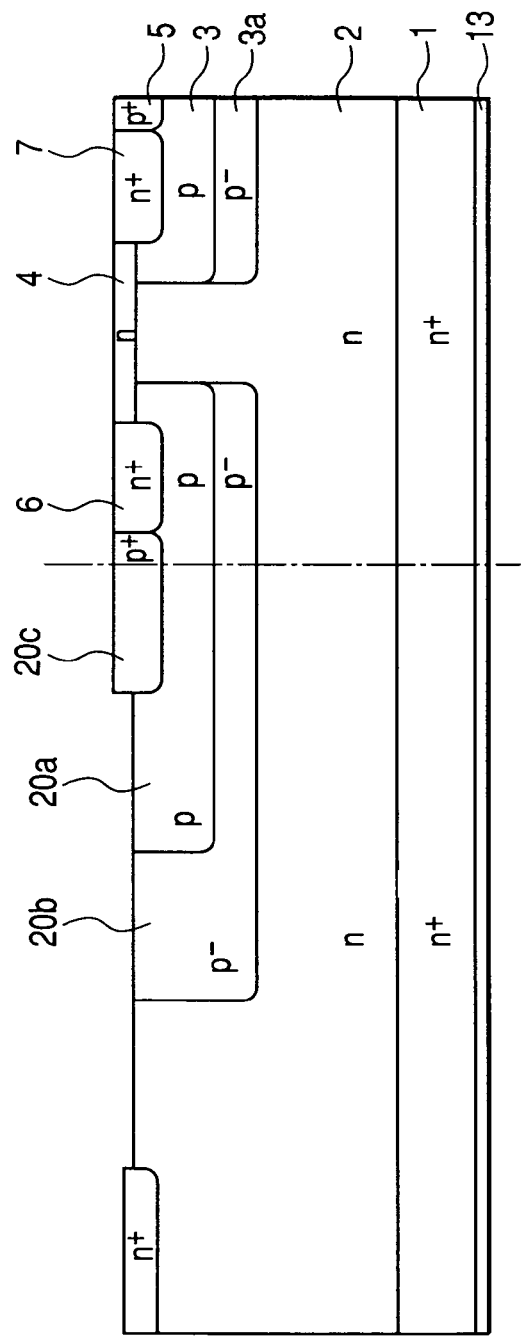

Manufacturing Process Shown in FIG. 3B

On the p-type base regions 3, the channel epi-layer 4 is epitaxially grown so as to have an impurity concentration of about $1\times10^{16}$ cm$^{-3}$, and a thickness (depth) of 0.3 µm. Subsequently, after forming a mask such as an LTO, this mask is opened in a prospective region for forming the p$^+$-type body layer 5 through a photolithography process. Next, boron ions are injected from above the mask. After removing the mask, a mask such as an LTO is formed to protect the substrate surface. And then, phosphorus ions are injected from the back surface side of the substrate 1. After removing the mask, a mask such as an LTO is formed again. This mask is opened in a prospective region for forming the n$^+$-type source region 6, 7 through a photolithography process. And then, phosphorus ions as n-type impurities are injected. Subsequently, after removing the mask, an activating heat treatment is performed at 1600 degrees C. for 30 minutes in order to activate the injected p-type and n-type impurities. As a consequence, the p$^+$-type body layer 5, the n$^+$-type source regions 6, 7, and the drain contact region 13 are formed.

Thereafter, a remaining portion of the channel epi-layer 4 in the circumferential portion is removed by etching using a mask.

Manufacturing Process Shown in FIG. 4A

The gate oxidation film 8 is formed in this process. More specifically, by performing oxidation using a pyrogenic method in a wet environment, the gate oxidation film 8 is formed.

Manufacturing Process Shown in FIG. 4B

On the surface of the gate oxidation film 8, a polysilicon layer doped with n-type impurities is formed at a temperature of 600 degrees C. to have a thickness of about 440 nm. Subsequently, the polysilicon layer and the gate oxidation film 8 are patterned using a resist as a mask, which is formed by photolithography etching. As a consequence, the gate electrode 9 is formed.

Figure 5A:
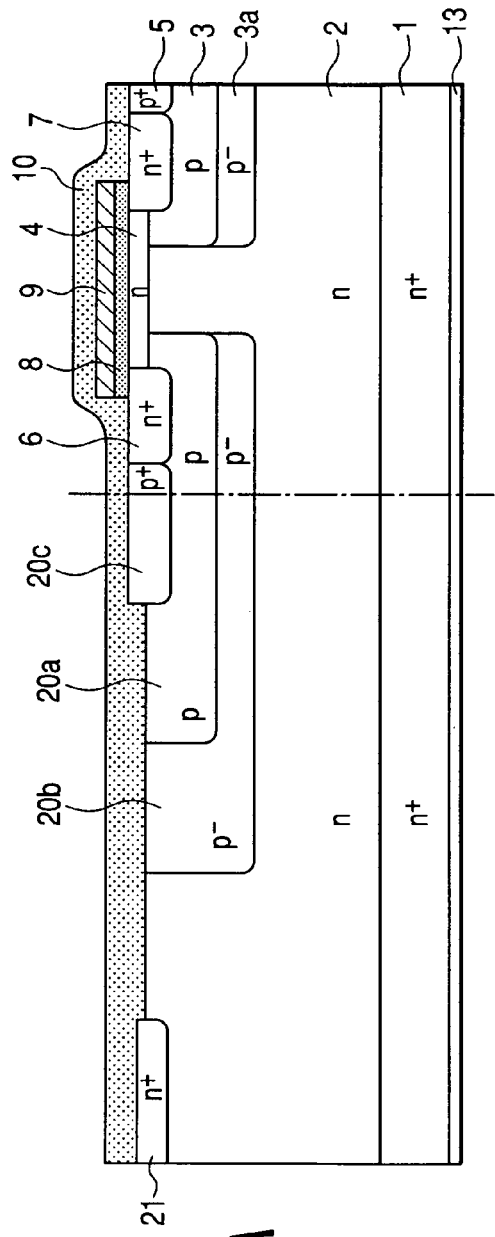
FIGS. 5A and 5B are diagrams for explaining the method of manufacturing the SiC semiconductor device.

Manufacturing Process Shown in FIG. 5A

In this process, the inter-layer insulation film 10 is formed in the cell portion and the circumferential portion. For example, the inter-layer insulation film 10 may be formed by forming a BPSG by plasma CVD at a temperature of 420 degrees C. to a thickness of about 670 nm, and then performing a reflow treatment at a temperature of 930 degrees C. for 20 minutes in a wet environment.

Figure 5B:
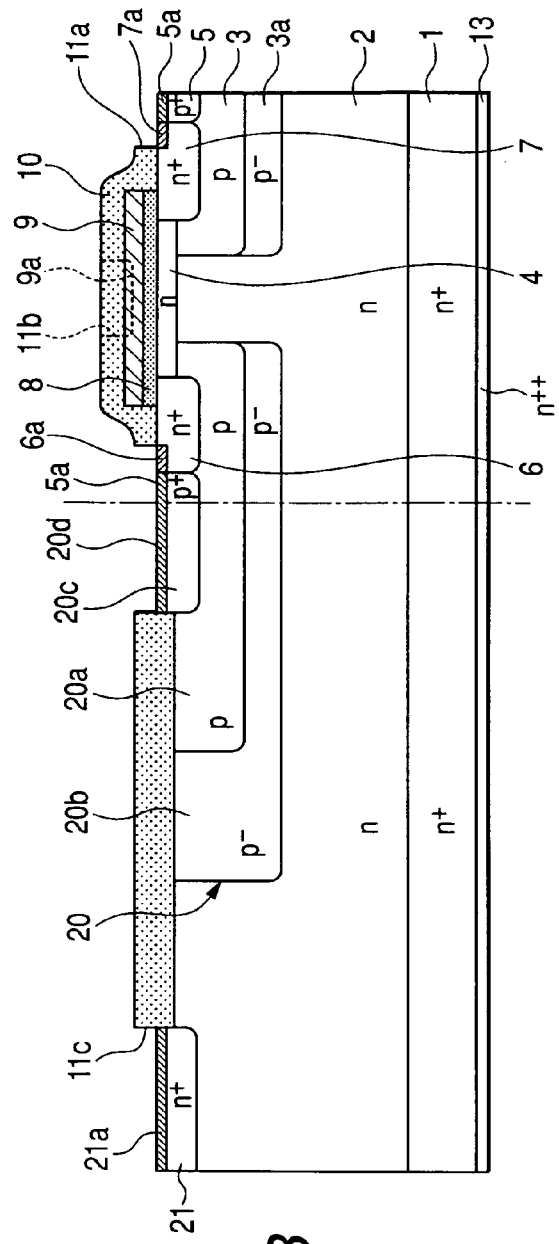

Manufacturing Process Shown in FIG. 5B

The inter-layer insulation film 10 is patterned using a resist as a mask, which may be formed by photolithography etching, in order to form the contact holes 11a, 11c leading to the p$^+$-type body layer 5 or the n$^+$-type source regions 6, 7, and the equipotential ring 21, and also to form the contact hole 11b leading to the gate electrode 9.

Thereafter, although not shown in the drawing, a contact metal layer made of Ni or Ti/Ni is formed so as to fill in the contact holes 11a, 11b. Subsequently, the contact metal layer is patterned in order to form the contact portions 5a-7a, 9a, 21a electrically connected to the p$^+$-type body layer 5 and the n$^+$-type source region 6, 7, or the gate electrode 9 and the equipotential ring 21. In addition, the drain electrode 14 is formed on the back surface side of the substrate 1 so as to be in contact with the drain contact region 13. Thereafter, the contact portions 5a-7a, 9a, 21a, and the drain electrode 14 are made ohmic contact with one other by performing an electrode sinter treatment in an Ar environment at a temperature below 700 degrees C. At this time, since each of the p$^+$-type body layer 5, n$^+$-type source region 6, 7, gate electrode 9, equipotential ring 21, and drain contact region 13 has a high impurity concentration, the contact portions 5a-7a, 9a, 21a, and the drain electrode 14 can be made ohmic contact with one other to a sufficient degree without performing a high temperature heat treatment.

Finally, by providing the source electrode 12 constituted by the underlayer wire electrode 12a made of Ti and the wire electrode 12b made of Al, and providing a gate wire, the planar-type MOSFET shown in FIG. 1 is completed.

In the above described method of manufacturing a planar-type MOSFET, the p-type base regions 3 and the first RESURF layer 20a are formed at the same time in the same process, and the less-doped p-type layer 3a and the second RESURF layer 20b are formed at the same time in the same process. This makes it possible to form the RESURF layer 20 with the minimum complexity.

Second Embodiment

Next, a second embodiment of the invention is described. The following description on the second embodiment focuses on the difference with the first embodiment, which is in the first and second RESURF layers 20a, 20b.

Figure 6:
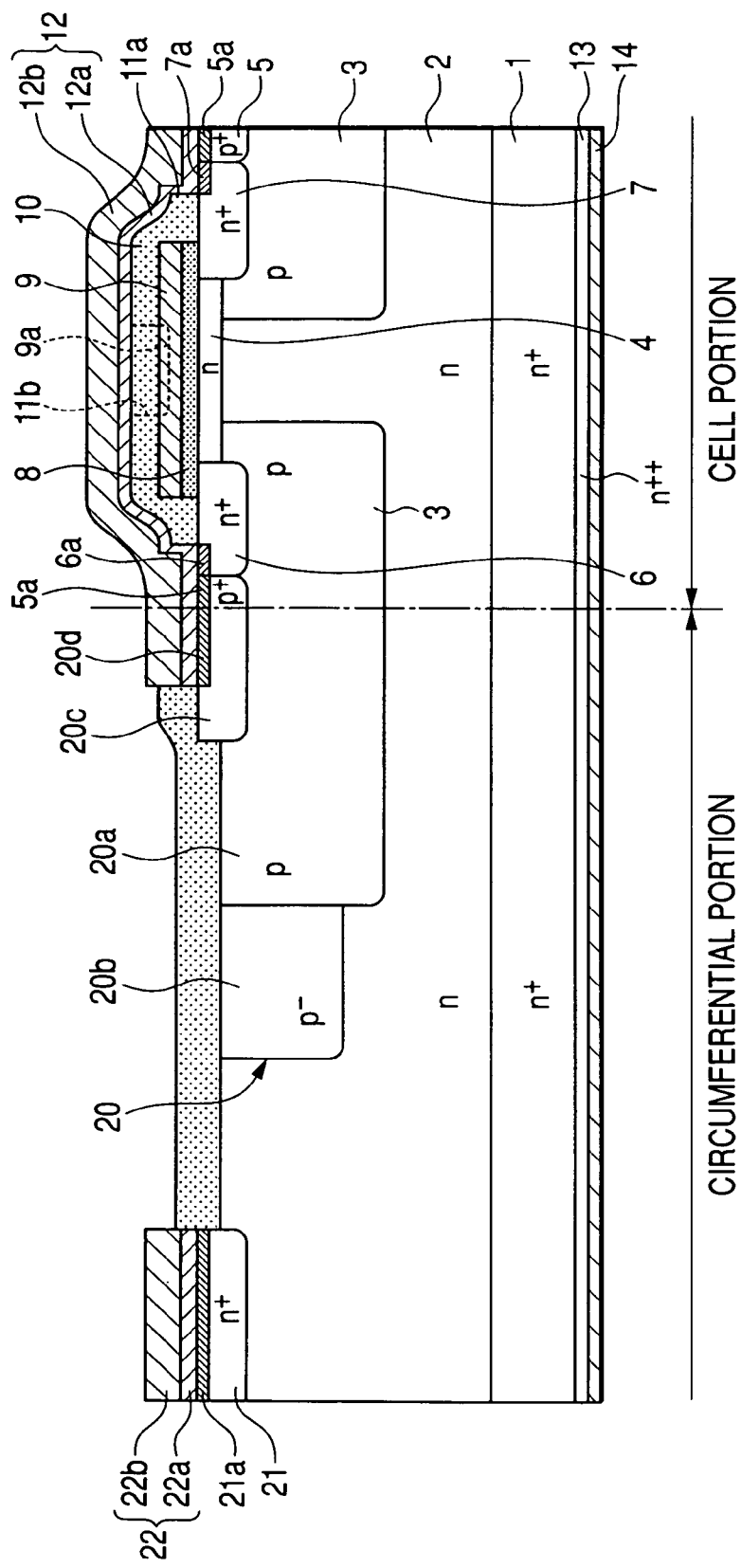
FIG. 6 is diagram showing a cross-section of a SiC semiconductor device according to a second embodiment of the invention, which is constituted by a planar type MOSFET and a circumferential portion.

FIG. 6 is a cross-sectional view of a SiC semiconductor device according to the second embodiment of the invention. As shown in FIG. 6, the thickness of the first. RESURF layer 20a in this embodiment is about twice that in the first embodiment, so that it becomes deeper than the second RESURF layer 20b. More specifically, in this embodiment, the first RESURF layer 20a has a thickness of from 0.8 to 2.0 µm, and an impurity concentration as low as about half that in the first embodiment, that is, from $5\times10^{17}$ to $1\times10^{19}$ cm$^{-3}$.

By increasing the thickness of the first RESURF layer 20a so that it is formed more deeply, since a breakpoint is located at a deeper position to make it possible to draw a surge, surge resistance can be improved. The characteristic of the RESURF layer 20 is determined not by its impurity concentration, but by a total amount of dopant (p-type impurities). By reducing the impurity concentration of the first RESURF layer 20a depending on the increase of the thickness of the first RESURF layer 20a, the total amount of the dopant in the first RESURF layer 20a in the second embodiment can be the same as that in the first embodiment.

Next, the surge resistance of the SiC semiconductor device of this second embodiment will be explained.

In a case where a motor is driven by a transistor such as a MOSFET, of various surges, a switching surge becomes the commonest cause of destroying the transistor. That is because, since the motor has an inductance, when a current flows from the transistor to the inductance, the inductor stores energy of $L\times I^3$ (L being a value of the inductance, I being a value of the current), and when the transistor is turned off, this energy is applied to the transistor.

Figure 7:
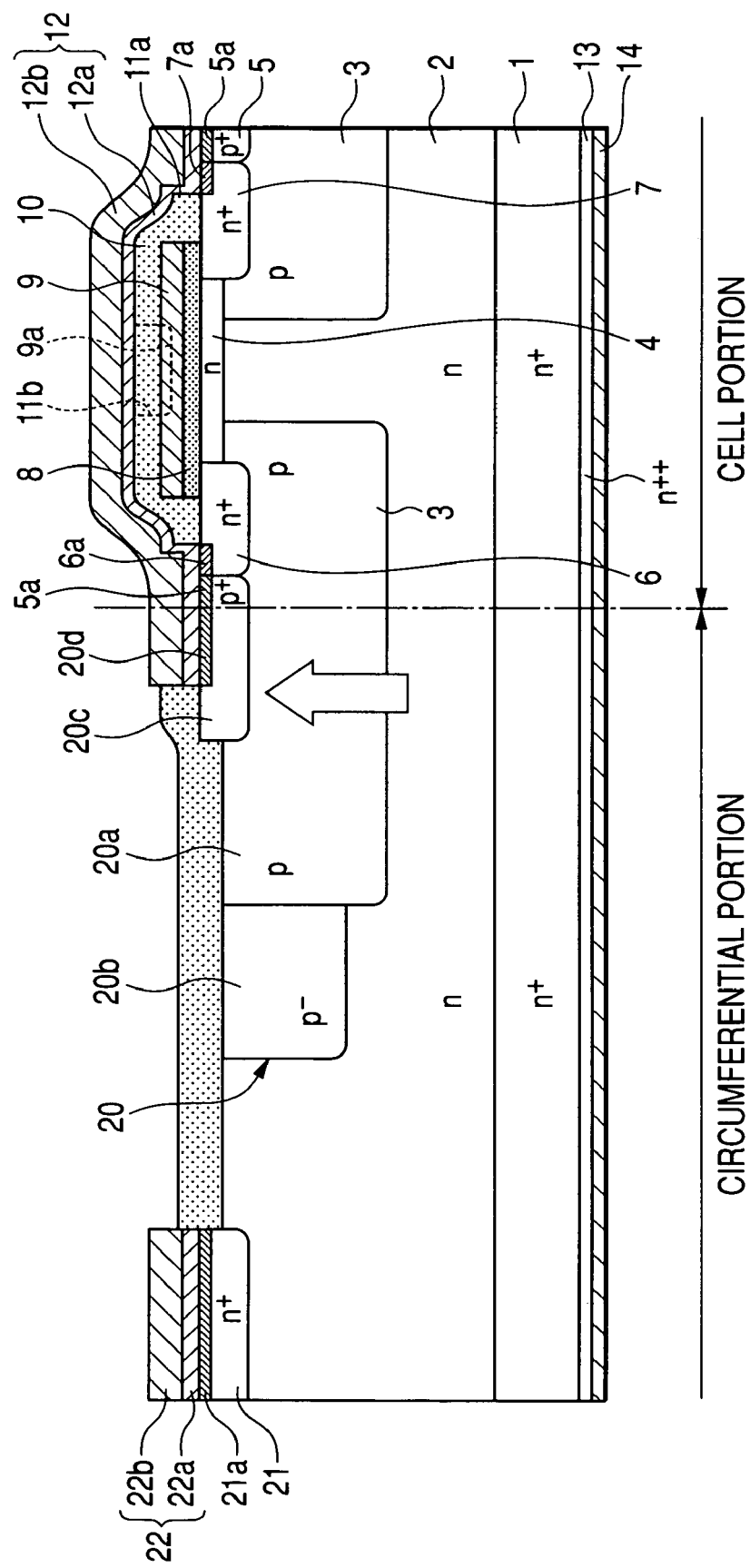
FIG. 7 is a diagram for explaining the effect of drawing a surge current in the second embodiment.

By increasing the thickness of the first RESURF layer 20a so that it is formed more deeply in order to set the breakpoint at a deeper position indicated by an arrow shown in FIG. 7, it becomes possible to draw such a switching surge.

Figure 8:
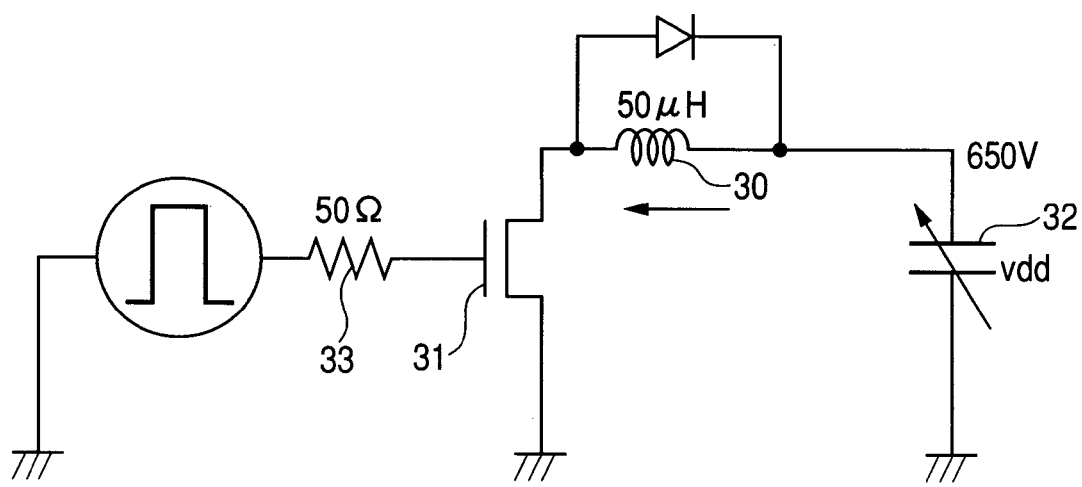
FIG. 8 is a circuit model diagram used to measure a switching surge resistance of the SiC semiconductor device of the second embodiment.

FIG. 8 is a circuit model diagram used to measure a switching surge resistance of the SiC semiconductor device of the second embodiment. As shown in FIG. 8, in this circuit model, an inductance 30 of 50 µH representing a motor is located on the high side of a transistor 31, a power supply 32 applies 650 V to the inductance 30, and a pulse-like gate voltage is applied to the gate of the transistor 31 through an input resistor 33 of 50Ω. The measurements on this circuit model show that the switching surge resistance of the first embodiment is 5 J/mm$^2$, and that of the second embodiment is 30 J/mm². As apparent from this measurement, the SiC semiconductor device of the second embodiment has highly improved surge resistance.

Third Embodiment

Next, a third embodiment of the invention is described. The following description on the third embodiment focuses on the difference with the first embodiment, which is in the first and second RESURF layers 20a, 20b.

Figure 9:
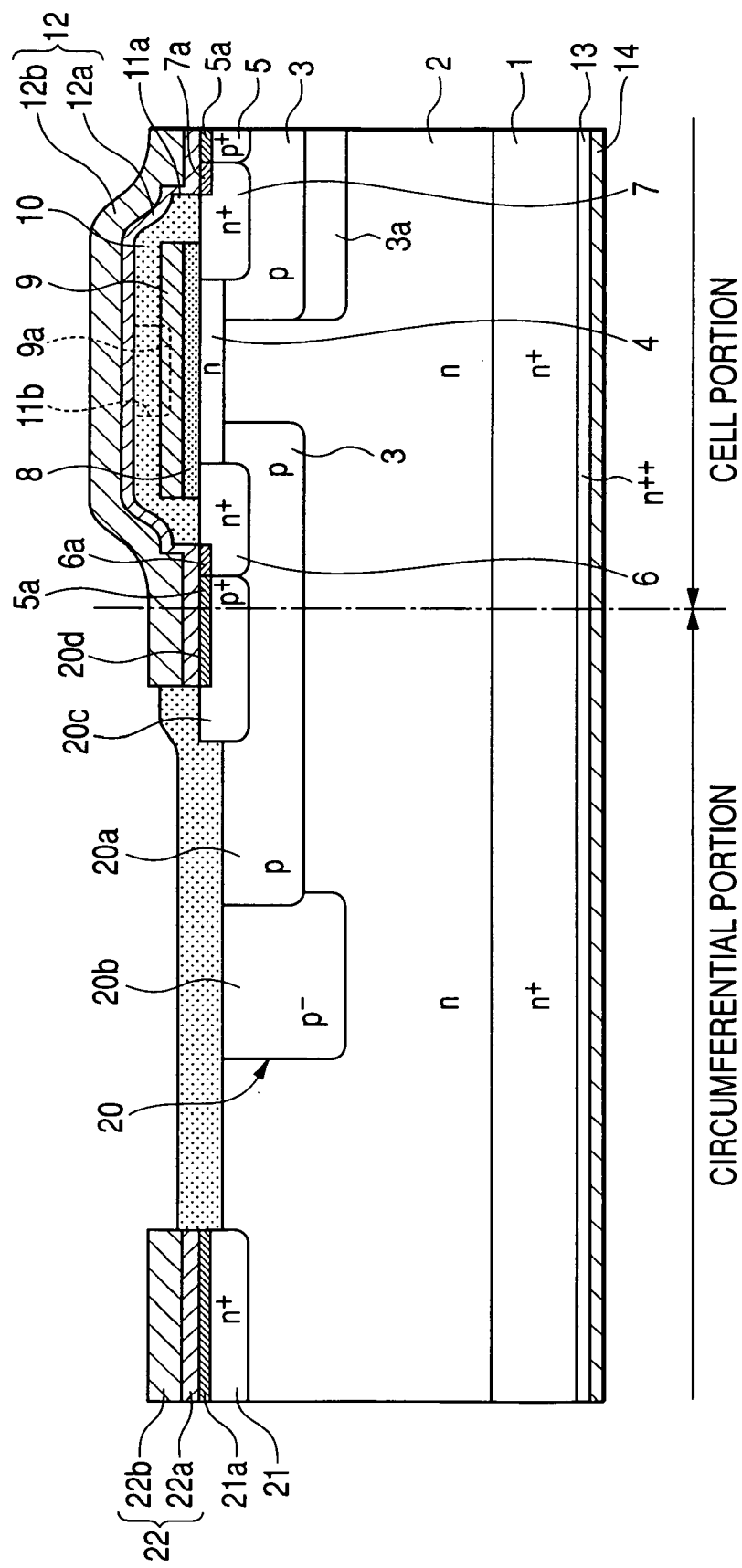
FIG. 9 is a diagram showing a cross-section of a SiC semiconductor device according to a third embodiment of the invention, which is constituted by a planar type MOSFET and a circumferential portion.
Figure 11A:
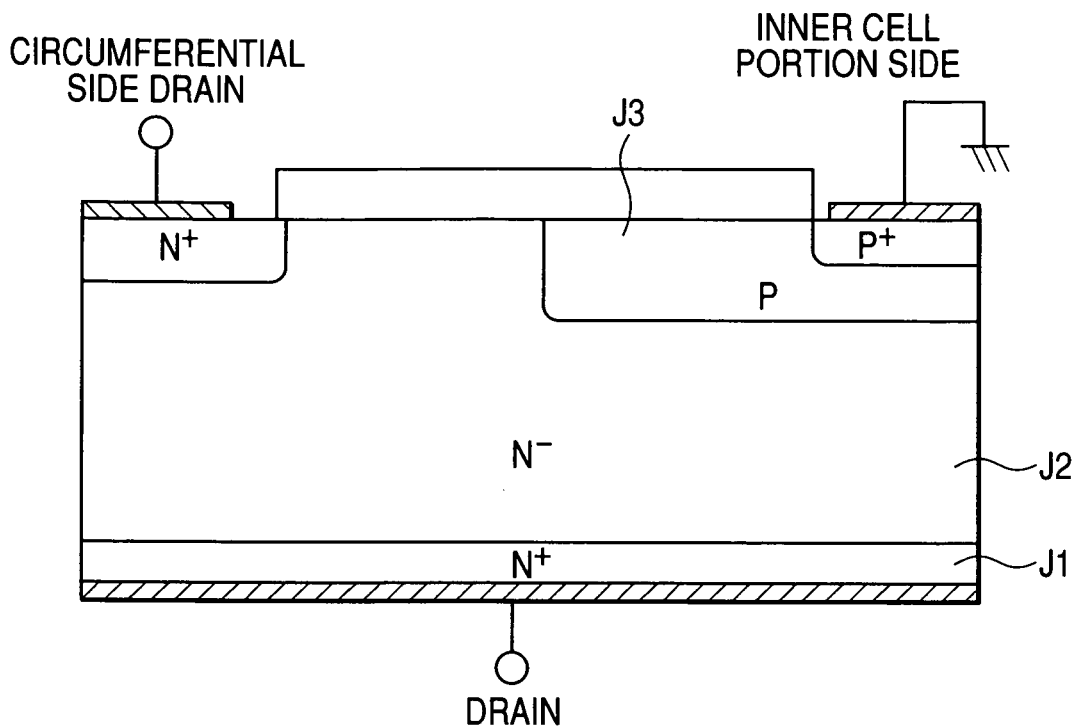
FIG. 11A is a diagram showing a RESURF structure of a silicon power device in a conventional SiC semiconductor device.
Figure 11B:
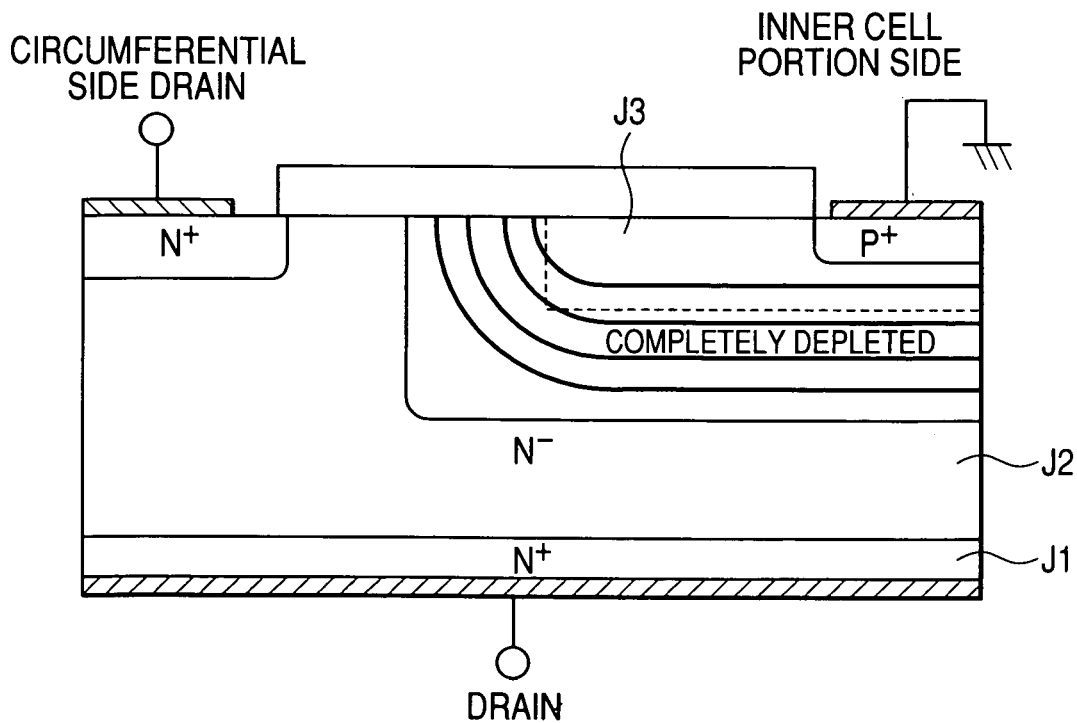
FIG. 11B is a diagram showing how a depletion layer extends in the power device when a voltage is applied between a circumferential portion and a back surface of a substrate of the power device.

FIG. 9 is a cross-sectional view of a SiC semiconductor device according to the third embodiment of the invention. As shown in FIG. 9, the third embodiment has such a structure that the second RESURF layer 20b is formed only in the circumferential portion of the first RESURF layer 20a, and not formed beneath first RESURF layer 20a except near the circumferential portion.

In this embodiment, the concentration of the p-type impurities of the second RESURF layer 20b is set to from $3 \times 10^{16}$ to $1 \times 10^{18}$ cm$^{-3}$, so that a total amount of dopant (p-type impurities) in the second RESURF layer 20b becomes the same as that in the first embodiment.

Next, the actions of the first and second RESURF layers 20a, 20b in this embodiment will be explained with reference to FIG. 10.

When a surge intrudes into the SiC semiconductor device, since the second RESURF layer 20b is the nearest to the substrate 1 of all the p-type regions, a breakdown occurs in a path indicated by an arrow (1) shown in FIG. 10, and the surge flows along this path.

However, since the second RESURF layer 20b is less doped, and accordingly has a high electric resistivity, the potential around the second RESURF layer 20b increases. This causes a breakdown to occur in the first RESURF layer 20a having a higher impurity concentration at a portion near the second RESURF layer 20b, as a consequence of which the surge flows along a path indicated by an arrow (2) shown in FIG. 10.

As explained above, according to the third embodiment, it is possible to disperse the position at which the breakdown occurs to thereby disperse the surge current. This provides the advantageous effect that the SiC semiconductor device becomes hard to thermally destroy. Incidentally, in accordance with a measurement of surge resistance performed by use of the circuit model as shown in FIG. 7, the SiC semiconductor device of the third embodiment has surge resistance of 345 J/mm².

It is a matter of course that various modifications can be made to the above described embodiments as set forth below.

The first to third embodiments have been described for the case where, in addition to the second RESURF layer 20b being formed in the circumferential portion, the less-doped p-type layer 3a is formed beneath the p-type base regions 3. However, it is possible that only the second RESURF layer 20b is formed in the circumferential portion without forming the less-doped p-type layer 3a.

In the first to third embodiments, although the process for forming the less-doped p-type layer 3a and the second RESURF layer 20b is performed before the process for forming the p-type base regions 3 and the first RESURF layer 20a, it may be performed after that process. The activation processes for the various impurity regions may be performed at the same time.

Although the first to third embodiments are directed to a accumulation-mode planar-type MOSFET, the present invention is applicable to an inversion-mode planar-type MOSFET in which the channel epi-layer 4 is not formed. Although the planar-type MOSFET described in each embodiment is a vertical power MOSFET, it may be a trench gate MOSFET. Although each embodiment is directed to an n-channel type MOSFET, the present invention is applicable to a p-channel type MOSFET.

In each embodiment, between the RESURF layer 20 and the equipotential ring 21, there may be provided a guard ring.

The above explained preferred embodiments are exemplary of the invention of the present application which is described solely by the claims appended below. It should be understood that modifications of the preferred embodiments may be made as would occur to one of skill in the art.

What is claimed is:

1. A silicon carbide semiconductor device comprising:
   a substrate of a first conduction type made of silicon carbide;
   a drift layer of said first conduction type made of silicon carbide, said drift layer being less doped than said substrate;
   a cell portion constituted by a part of said substrate and a part of said drift layer, said cell portion including semiconductor elements;
   a circumferential portion constituted by another part of said substrate and another part of said drift layer, said circumferential portion being formed so as to surround said cell portion; and
   a RESURF layer of a second conduction type formed in a surface portion of said drift layer so as to be located in said circumferential portion;
   wherein said RESURF layer is constituted by a first RESURF layer having a first impurity concentration, and a second RESURF layer having a second impurity concentration lower than said first impurity concentration, said second RESURF layer being in contact with an outer circumference of said first RESURF layer and extending to a circumference of said cell portion, and said second RESURF layer covering corners of said first RESURF layer.

2. The silicon carbide semiconductor device according to claim 1, wherein said second RESURF layer is formed throughout beneath said first RESURF layer.

3. The silicon carbide semiconductor device according to claim 1, wherein said first RESURF layer has an impurity concentration of from $1 \times 10^{18}$ to $2 \times 10^{19}$ cm$^{-3}$, and said second RESURF layer has an impurity concentration of from $5 \times 10^{16}$ to $2 \times 10^{18}$ cm$^{-3}$.

4. The silicon carbide semiconductor device according to claim 1, wherein said first RESURF layer has a thickness of from 0.4 to 1.0 µm, and said second RESURF layer has a thickness of 0.4 to 1.4 µm.

5. The silicon carbide semiconductor device according to claim 1, wherein said first RESURF layer is thicker than said second RESURF layer, said first RESURF layer has an impurity concentration of from $5 \times 10^{17}$ to $1 \times 10^{19}$ cm$^{-3}$, and said second RESURF layer has an impurity concentration of from $5 \times 10^{16}$ to $2 \times 10^{18}$ cm$^{-3}$.

6. The silicon carbide semiconductor device according to claim 5, wherein said first RESURF layer has a thickness of from 0.8 to 2.0 µm, and said second RESURF layer has a thickness of from 0.4 to 1.4 µm.

7. The silicon carbide semiconductor device according to claim 1, wherein said semiconductor elements include:
   a base region of said second conduction type made of silicon carbide and formed in said surface portion of said drift layer;

a doped region of said first conduction type made of silicon carbide and formed in said base region, said doped region being more highly doped than said drift layer;
a channel region of said first conduction type made of silicon carbide and formed on a surface of said base region so as to connect between said drift layer and said doped region;
a gate insulation film formed on a surface of said channel region;
a gate electrode formed on said gate insulation film;
a first electrode electrically connected to said doped region; and
a second electrode formed on a back surface of said substrate;
said semiconductor elements constituting a MOSFET that operates to control a channel formed in said channel region, and a current flowing between said first and second electrodes through said doped region and said drift layer in accordance with a voltage applied to said gate electrode,
said first RESURF layer being extending from said base region of said MOSFET.

8. The silicon carbide semiconductor device according to claim 7, wherein a doped region of said second conduction type less doped than said base region is formed beneath said base region so as to have the same depth as said second RESURF layer.

9. The silicon carbide semiconductor device according to claim 7, wherein said base region and said first RESURF layer have the same depth as each other.

10. The silicon carbide semiconductor device according to claim 8, wherein said second RESURF layer and said doped region of said second conduction type are layers formed at the same time by injecting impurities of said second conduction type into said drift layer.

11. The silicon carbide semiconductor device according to claim 9, wherein said first RESURF layer and said base region are layers formed at the same time by injecting impurities of said second conduction type into said drift layer.

12. The silicon carbide semiconductor device according to claim 1, wherein said semiconductor elements include:
a base region of said second conduction type made of silicon carbide and formed in said surface portion of said drift layer;
a doped region of said first conduction type made of silicon carbide and formed in said base region, said doped region being more highly doped than said drift layer, a part of a surface portion of said base region located between said drift layer and said doped region serving as a channel;
a gate insulation film formed on a surface of said channel;
a gate electrode formed on said gate insulation film;
a first electrode electrically connected to said doped region; and
a second electrode formed on a back surface of said substrate;
said semiconductor elements constituting a MOSFET that operates to control said channel, and a current flowing between said first and second electrodes through said doped region and said drift layer in accordance with a voltage applied to said gate electrode,
said first RESURF layer extending from said base region of said MOSFET.

13. The silicon carbide semiconductor device according to claim 12, wherein a doped region of said second conduction type less doped than said base region is formed beneath said base region so as to have the same depth as said second RESURF layer.

14. The silicon carbide semiconductor device according to claim 12, wherein said base region and said first RESURF layer have the same depth as each other.

15. The silicon carbide semiconductor device according to claim 13, wherein said second RESURF layer and said doped region of said second conduction type are layers formed at the same time by injecting impurities of said second conduction type into said drift layer.

16. The silicon carbide semiconductor device according to claim 14, wherein said first RESURF layer and said base region are layers formed at the same time by injecting impurities of said second conduction type into said drift layer.

17. A silicon carbide semiconductor device comprising:
a substrate of a first conduction type that is made of silicon carbide;
a drift layer of the first conduction type that is made of silicon carbide and that has a lower impurity concentration than the substrate;
a cell portion that is configured with a part of the substrate and a part of the drift layer and that includes semiconductor elements;
a circumferential portion that is configured with a part of the substrate and a part of the drift layer and that surrounds the cell portion;
a first RESURF layer of a second conduction type that is formed in a surface portion of the drift layer between the cell portion and the circumferential portion, and that has corners on its bottom area; and
a second RESURF layer of the second conduction type that has a lower impurity concentration than the first RESURF layer, wherein
the second RESURF layer contacts an outer circumference of the first RESURF layer, extends to a circumference of the cell portion, and covers the corners of the first RESURF layer.

18. The silicon carbide semiconductor device according to claim 17, wherein the second RESURF layer is formed along an entire underside of the first RESURF layer.

19. The silicon carbide semiconductor device according to claim 17, wherein the first RESURF layer has an impurity concentration of from $1\times10^{18}$ to $2\times10^{19}$ cm$^{-3}$, and the second RESURF layer has an impurity concentration of from $5\times10^{16}$ to $2\times10^{18}$ cm$^{-3}$.

20. The silicon carbide semiconductor device according to claim 17, wherein the first RESURF layer has a thickness of from 0.4 to 1.0 μm, and the second RESURF layer has a thickness of 0.4 to 1.4 μm.

* * * * *